United States Patent
Kishimoto et al.

(10) Patent No.: US 12,249,628 B2
(45) Date of Patent: Mar. 11, 2025

(54) METHOD OF FORMING P-TYPE NITRIDE SEMICONDUCTOR LAYER

(71) Applicants: Kyoto University, Kyoto (JP); Nichia Corporation, Anan (JP)

(72) Inventors: Katsuhiro Kishimoto, Kyoto (JP); Mitsuru Funato, Kyoto (JP); Yoichi Kawakami, Kyoto (JP); Kunimichi Omae, Anan (JP)

(73) Assignees: KYOTO UNIVERSITY, Kyoto (JP); NICHIA CORPORATION, Anan (JP)

( * ) Notice: Subject to any disclaimer, the term of this patent is extended or adjusted under 35 U.S.C. 154(b) by 0 days.

(21) Appl. No.: 18/329,191

(22) Filed: Jun. 5, 2023

(65) Prior Publication Data

US 2023/0326976 A1    Oct. 12, 2023

Related U.S. Application Data

(62) Division of application No. 16/674,824, filed on Nov. 5, 2019, now abandoned.

(30) Foreign Application Priority Data

Nov. 7, 2018 (JP) .................. 2018-210033

(51) Int. Cl.
H01L 21/02 (2006.01)
H01L 29/20 (2006.01)
H01L 29/78 (2006.01)
H01L 33/00 (2010.01)
H01L 33/32 (2010.01)

(52) U.S. Cl.
CPC ...... *H01L 29/2003* (2013.01); *H01L 21/0254* (2013.01); *H01L 21/0262* (2013.01); *H01L 29/78* (2013.01); *H01L 33/007* (2013.01); *H01L 33/0075* (2013.01); *H01L 33/32* (2013.01)

(58) Field of Classification Search
CPC .................................. H01L 21/0262
USPC .......................................... 438/46
See application file for complete search history.

(56) References Cited

U.S. PATENT DOCUMENTS

| | | | |
|---|---|---|---|
| 2010/0015786 A1* | 1/2010 | Kohji | C23C 16/45576 118/728 |
| 2012/0193640 A1 | 8/2012 | Sakai | |
| 2013/0001644 A1* | 1/2013 | Fujikura | H01L 29/205 257/190 |

(Continued)

FOREIGN PATENT DOCUMENTS

| | | |
|---|---|---|
| JP | 2014-179584 A | 9/2014 |
| JP | 6249372 B2 * | 12/2017 |
| WO | WO 2013/165134 A1 | 11/2013 |

OTHER PUBLICATIONS

Machine translation of Kitamura et al., JP-6249372-B2 (Year: 2017).*

(Continued)

*Primary Examiner* — Hsin Yi Hsieh
(74) *Attorney, Agent, or Firm* — Birch, Stewart, Kolasch & Birch, LLP

(57) ABSTRACT

A semiconductor device includes a p-type nitride semiconductor layer, the p-type nitride semiconductor layer including an Al-containing nitride semiconductor layer and an Al-containing compound layer containing Al and C as main constituent elements and provided on the surface of the Al-containing nitride semiconductor layer.

6 Claims, 6 Drawing Sheets

(56) References Cited

U.S. PATENT DOCUMENTS

| | | |
|---|---|---|
| 2013/0059719 A1 | 3/2013 | Akamine et al. |
| 2013/0313577 A1 | 11/2013 | Sakai |
| 2014/0147995 A1 | 5/2014 | Kawanishi |
| 2014/0225153 A1 | 8/2014 | Kawanishi |
| 2017/0194529 A1 | 7/2017 | Wang et al. |

OTHER PUBLICATIONS

Advisory Action issued in U.S. Appl. No. 16/674,824, dated Dec. 8, 2022.
Final Office Action issued in U.S. Appl. No. 16/674,824, dated Nov. 24, 2021.
Final Office Action issued in U.S. Appl. No. 16/674,824, dated Sep. 22, 2022.
Non-Final Office Action issued in U.S. Appl. No. 16/674,824, dated Mar. 16, 2022.
Non-Final Office Action issued in U.S. Appl. No. 16/674,824, dated Mar. 3, 2023.
Non-Final Office Action issued in U.S. Appl. No. 16/674,824, dated May 26, 2021.
Restriction/Election issued in U.S. Appl. No. 16/674,824, dated Jan. 26, 2021.
Sawaki et al., "Impurity incorporation in semipolar (1-1 0 1) GaN grown on an Si substrate", Semiconductor Science and Technology, 27, (2012), 024006 (5pp), pp. 1-5.
Wang et al., "Structure Characteristics and Stability of CnAl (n=2-11) Clusters", Jun. 2007, Acta Physico-Chimica Sinica, vol. 23, Issue 6, pp. 873-876 (Year: 2007).
Wongchotigul et al., "Low resistivity aluminum nitride: carbon (AlN: C) films grown by metal organic chemical vapor deposition", Materials Letters 26, Mar. 1996, pp. 223-226.
Wu et al., "Environmentally friendly method to grow wide-bandgap semiconductor aluminum nitride crystals: Elementary source vapor phase epitaxy", Scientific Reports 5, 17405, Nov. 30, 2015, total of 9 pages.

* cited by examiner

METHOD OF FORMING P-TYPE NITRIDE SEMICONDUCTOR LAYER

CROSS-REFERENCE TO RELATED APPLICATION

This application is a Divisional of co-pending U.S. application Ser. No. 16/674,824, filed on Nov. 5, 2019, which is based upon and claims the benefit of priority from Japanese Patent Application No. 2018-210033, filed on Nov. 7, 2018, all of which are hereby expressly incorporated by reference into the present application.

BACKGROUND

Technical Field

The present disclosure relates to semiconductor devices, and more specifically, to a semiconductor device including a nitride semiconductor and a method for forming a p-type nitride semiconductor layer.

Description of the Related Art

In recent years, nitride semiconductor light-emitting devices, such as light-emitting diodes (LEDs) formed using nitride semiconductors, have been widely used. A nitride semiconductor light-emitting device is fabricated, for example, by growing a plurality of nitride semiconductor layers, which includes an n-type nitride semiconductor layer, a light-emitting layer, and a p-type nitride semiconductor layer, on a sapphire substrate. Usually, in the nitride semiconductor light-emitting device, a nitride semiconductor doped with Si is used as the n-type nitride semiconductor layer, while a nitride semiconductor doped with Mg is used as the p-type nitride semiconductor layer.

However, the p-type nitride semiconductor doped with Mg has a problem of not achieving sufficient concentration of holes depending on the composition of the nitride semiconductor, for example, in a nitride semiconductor containing Al. In addition, light-emitting devices with a short emission wavelength have been increasingly developed recently, but in particular nitride semiconductors mainly used in this type of light-emitting device contain a large amount of Al, which poses a problem that the hole concentration is further lowered. To produce a p-type nitride semiconductor by doping with Mg, the doped Mg needs to be activated, for example, by being annealed at a temperature of several hundred degrees after the doping. However, the activation may not be sufficiently accomplished by only the annealing, depending on annealing conditions, particularly in an Al-containing nitride semiconductor even though the Al content is small. To solve these problems, JP 2014-179584 A has proposed doping with C as a p-type impurity in place of Mg.

SUMMARY

However, also as mentioned in JP 2014-179584 A, the p-type nitride semiconductor obtained by doping with Mg or C has a limitation on the acceptable content of Al therein.

This makes it difficult to provide a semiconductor device that requires a nitride semiconductor having a large content of Al, in other words, a large bandgap. Thus, the semiconductor device including the nitride semiconductor cannot be used enough in various applications.

Accordingly, it is an object of the present disclosure to provide a semiconductor device which includes a nitride semiconductor and can be used in various applications.

In addition, it is another object of the present disclosure to provide a method for forming a p-type nitride semiconductor layer which enables the manufacture of a semiconductor device usable in various applications and including a nitride semiconductor so that the formed p-type nitride semiconductor layer can exhibit p-type conductivity without being limited to any Al content.

To achieve the foregoing object, a semiconductor device according to the present disclosure is a semiconductor device that includes a p-type nitride semiconductor layer. The p-type nitride semiconductor layer includes an Al-containing nitride semiconductor layer and an Al-containing compound layer containing Al and C as main constituent elements and provided on a surface of the Al-containing nitride semiconductor layer.

A method for forming a p-type nitride semiconductor layer according to the present disclosure includes the steps of:

preparing a base; and providing a p-type nitride semiconductor layer on or above the base by forming an Al-containing nitride semiconductor layer on or above the base and then forming an Al-containing compound layer containing Al and C as main constituent elements on a surface of the Al-containing nitride semiconductor layer by supplying a source gas including a source gas of Al and a source gas of C.

In the semiconductor device according to the present disclosure mentioned above, the p-type nitride semiconductor layer includes the Al-containing nitride semiconductor layer and the Al-containing compound layer containing Al and C as main constituent elements and provided on the surface of the Al-containing nitride semiconductor layer. With this configuration, the semiconductor device includes the nitride semiconductor layer and can be used in various applications.

The method for forming a p-type nitride semiconductor layer according to the present disclosure includes the step of providing the p-type nitride semiconductor layer on or above the base by forming the Al-containing nitride semiconductor layer on or above the base and then forming the Al-containing compound layer on the surface of the Al-containing nitride semiconductor layer by supplying the source gases including the source gas of Al and the source gas of C, the Al-containing compound layer containing Al and C as main constituent elements. With this configuration, the method makes it possible to provide the p-type nitride semiconductor layer that can exhibit the p-type conductivity without being limited to any Al content.

DETAILED DESCRIPTION OF THE EMBODIMENT

Embodiments according to the present disclosure will be described below with reference to the accompanying drawings.

First Embodiment

A first embodiment according to the present disclosure relates to a p-type nitride semiconductor layer that can be used in a semiconductor device including a nitride semiconductor.

Figure 1:
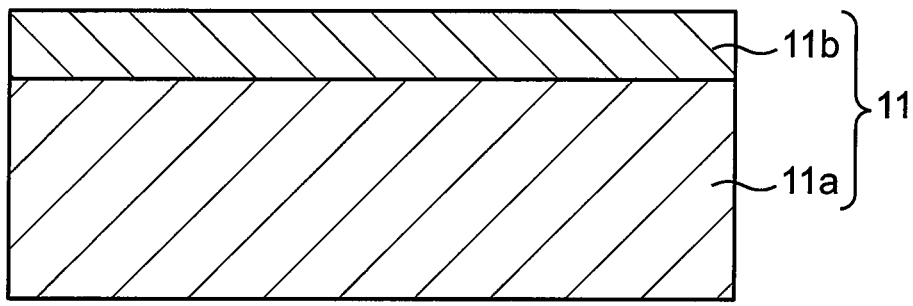
FIG. 1 is a cross-sectional view of a p-type nitride semiconductor layer in a first embodiment according to the present disclosure.

As shown in FIG. 1, a p-type nitride semiconductor layer 11 of the first embodiment includes (a) an Al-containing nitride semiconductor layer 11a and (b) an Al-containing compound layer 11b containing Al and C as main constituent elements and provided on the surface of the Al-containing nitride semiconductor layer. The p-type nitride semiconductor layer 11 is considered to exhibit p-type conductivity without depending on an impurity level which is formed in a bandgap by p-type impurities, such as Mg or C.

That is, the p-type nitride semiconductor layer 11 of the first embodiment is considered to exhibit the p-type conductivity even when each of the Al-containing nitride semiconductor layer 11a and the Al-containing compound layer 11b does not have any impurity level associated with the doping of p-type impurities, such as Mg or C.

The reason why the p-type nitride semiconductor layer 11 of the first embodiment exhibits the p-type conductivity is not clear, but is considered to be that a hole accumulation layer is formed in the vicinity of the interface between the Al-containing nitride semiconductor layer 11a and the Al-containing compound layer 11b. Specifically, it is considered that the band diagram of energy levels in the p-type nitride semiconductor layer 11 curves upward (toward the higher energy side) at the interface between the Al-containing nitride semiconductor layer 11a and the Al-containing compound layer 11b, so that a hole accumulation layer is formed in the vicinity of the interface at the curved part of the band diagram, thereby exhibiting the p-type conductivity.

Figure 3:
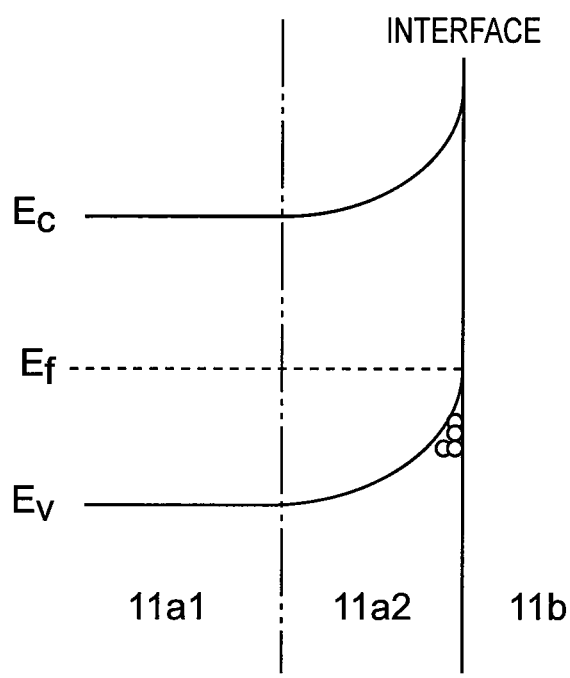
FIG. 3 shows the band diagram of the vicinity of an interface between an Al-containing nitride semiconductor layer and an Al-containing compound layer shown in FIG. 2.

For example, as shown in FIG. 3, the band diagram on the Al-containing nitride semiconductor layer 11a side curves upward (toward the higher energy side) in the vicinity of the interface between the Al-containing nitride semiconductor layer 11a and the Al-containing compound layer 11b due to the composition (for example, Al content) of the Al-containing nitride semiconductor layer 11a and the composition (for example, Al content) of the Al-containing compound layer 11b. Consequently, holes are accumulated in a curved region on the Al-containing nitride semiconductor layer 11a side to form the hole accumulation layer.

Figure 2:
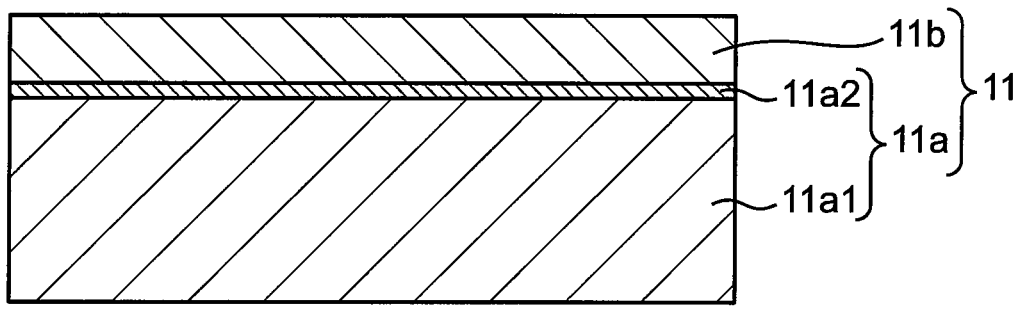
FIG. 2 is a cross-sectional view showing a hole accumulation layer added to the cross-sectional view of FIG. 1.

It is noted that in FIG. 2, the hole accumulation layer formed in the Al-containing nitride semiconductor layer 11a in the vicinity of the interface is denoted by reference numeral 11a2, whereas a part of the Al-containing nitride semiconductor layer 11a excluding the hole accumulation layer 11a2 is denoted by reference numeral 11a1.

Since the band diagram itself at the interface between the Al-containing nitride semiconductor layer 11a and the Al-containing compound layer 11b realizes the p-type conductivity in this way, the p-type conductivity is considered not to be due to the impurity level formed in the bandgap by the p-type impurities, such as Mg or C. The hole accumulation layer could be formed on the Al-containing compound layer 11b side in the vicinity of the interface, depending on the composition (for example, Al content) of the Al-containing nitride semiconductor layer 11a and the composition (for example, Al content) of the Al-containing compound layer 11b.

By considering the results shown in Examples below, it is understood that the p-type conductivity, which is exhibited in the Al-containing nitride semiconductor layer 11a and the Al-containing compound layer 11b, is not necessarily exhibited only in the Al-containing nitride semiconductor layer 11a having a specific Al content and the Al-containing compound layer 11b having a specific Al content.

That is, the Al-containing nitride semiconductor layer 11a only needs to contain at least aluminum and may be composed of, for example, $Al_XGa_{1-X}N$ ($0<X\leq1$). The Al-containing nitride semiconductor layer 11a may further contain In. Since the composition of a quaternary compound semiconductor, such as AlInGaN, is more likely to fluctuate in composition ratio, the Al-containing nitride semiconductor layer 11a is preferably composed of a binary compound semiconductor AlN or a ternary compound semiconductor AlGaN.

The Al-containing compound layer 11b only needs to contain at least Al and C. The Al content in the Al-containing compound layer 11b is set so that the composition ratio of C to Al is, for example, 0.1 to 10, preferably 0.2 to 3, and more preferably 0.5 to 2. The Al-containing compound layer 11b may further contain other elements, such as oxygen (O) and nitrogen (N), and inevitable impurities mixed therein. Examples of the material of the Al-containing compound layer 11b include $AlC_2$, $Al_4C_3$, $Al_5C_3N$, $Al_2OC$, $Al_4O_4C$, and the like. When the surfaces of samples produced by the inventors in an investigation process were analyzed by a time-of-flight secondary ion mass spectrometry (TOF-SIMS), it was confirmed that an Al-containing compound layer represented by $AlC_2$ with a thickness of less than 10 nm was formed in each sample.

The p-type nitride semiconductor layer 11 may be thin. For example, a total thickness of the Al-containing nitride semiconductor layer 11a and the Al-containing compound layer 11b may be 10 nm or less. Since the Al-containing nitride semiconductor layer 11a has a relatively high resistance, when using the p-type nitride semiconductor layer 11 as a contact layer of an LED or the like as mentioned later, the total thickness of the Al-containing nitride semiconductor layer 11a and the Al-containing compound layer 11b is preferably thin and is preferably 10 nm or less. The thickness of the Al-containing compound layer 11b may be less than 10 nm.

Figure 4:
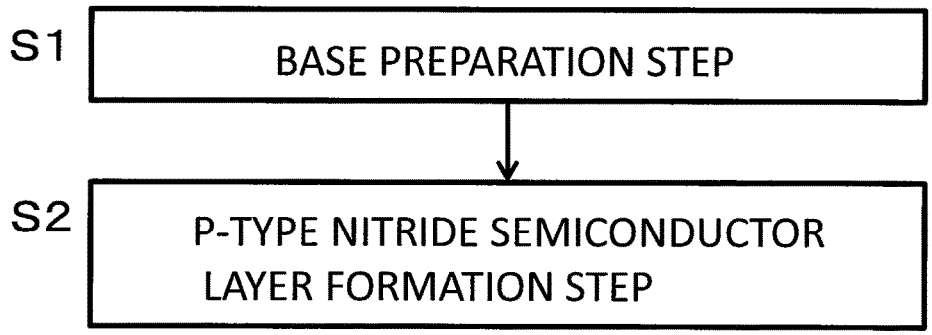
FIG. 4 is a process flow in a method for forming a p-type nitride semiconductor layer of the first embodiment.

As shown in FIG. 4, the method for forming a p-type nitride semiconductor layer 11 in the above-mentioned first embodiment includes, for example, a step S1 of preparing a base and a step S2 of forming a p-type nitride semiconductor layer.

In the step S2 of forming a p-type nitride semiconductor layer, the Al-containing nitride semiconductor layer 11a is formed on or above the base, and then the Al-containing compound layer 11b is formed on a surface of the Al-containing nitride semiconductor layer 11a by supplying source gases including a source gas of Al and a source gas of C so as to contain Al and C as main constituent elements.

Figure 6:
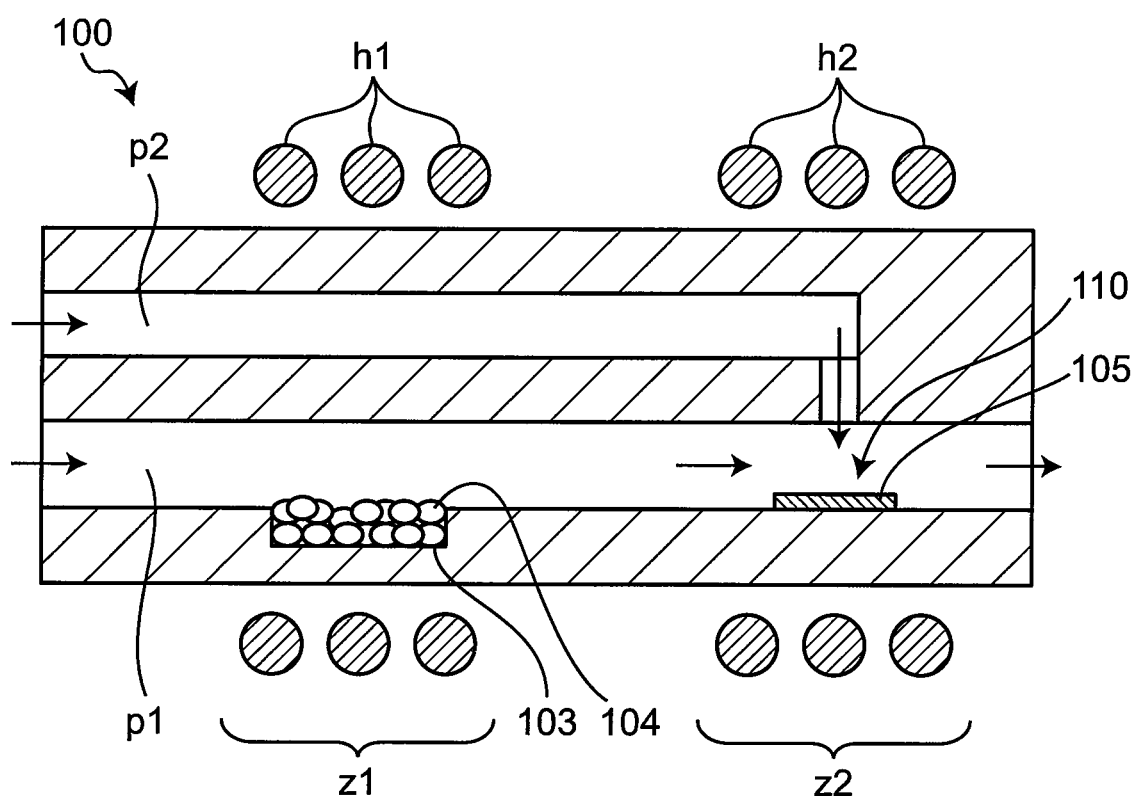
FIG. 6 is a cross-sectional view of a growth reactor for growing an Al-containing compound layer in the first embodiment.

The formation of the Al-containing compound layer 11b in the step S2 of forming the p-type nitride semiconductor layer can be performed using, for example, a growth reactor 100 shown in FIG. 6, which has a first flow path p1 and a second flow path p2 that has its one end merging with the first flow path p1. In the growth reactor 100, the second flow path p2 is provided so that the gas flowing through the second flow path p2 merges with the gas flowing through the first flow path p1 from above.

In the growth reactor 100 configured as mentioned above, a base 105 is disposed at a merging position of the first flow path p1 with the second flow path p2, and then the source gas of Al is supplied from the first flow path p1, while the source gas of C is supplied from the second flow path p2. Thus, the Al-containing compound layer is formed on or above the base 105 disposed at the merging position between the first flow path and the second flow path.

Here, in the growth reactor 100, an Al metal 104 disposed within a raw material storage portion 103 in the first flow path p1 is heated with a first heater h1 provided in a raw material zone z1 to produce vaporized source gas of Al, which is used as the source gas of the process.

For example, $C_3H_8$, $C_2H_2$, $CBr_4$, $CCl_4$ or the like can also be used as the source gas of C, and especially $C_3H_8$ (propane) is preferably used.

As shown in FIG. 6, in the growth reactor 100, a second heater h2 is provided in a growth zone z2. By controlling the second heater h2, the growth zone z2 can be set at a predetermined temperature.

Figure 5:
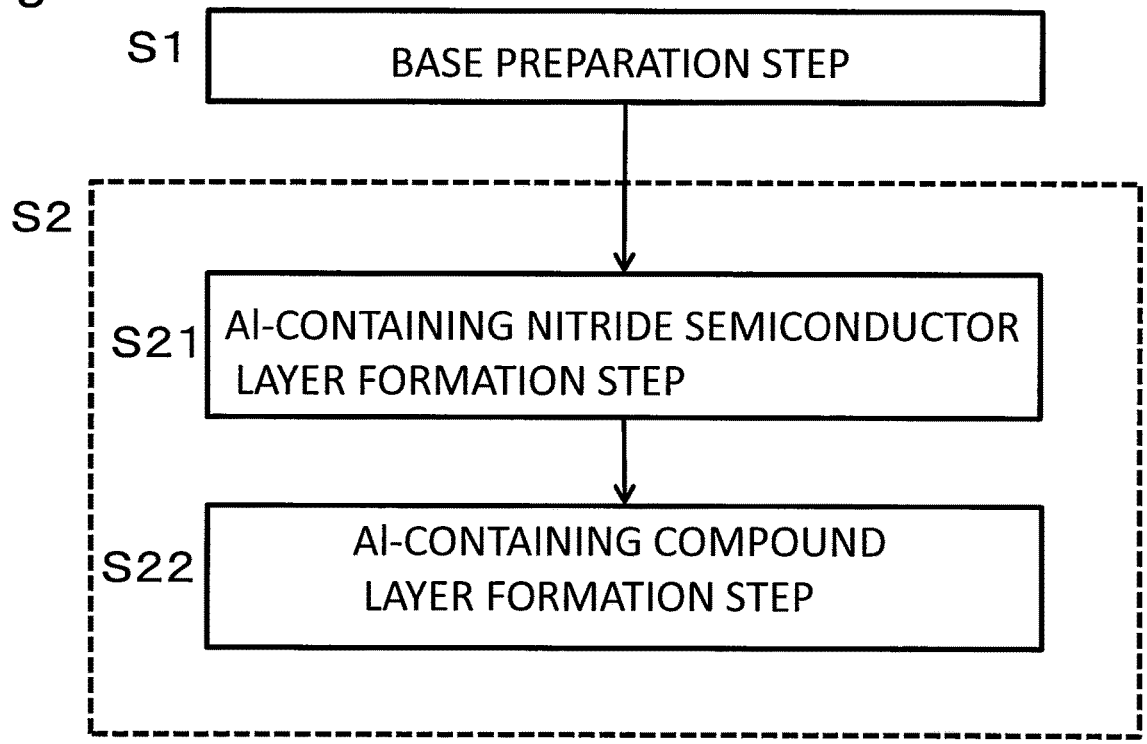
FIG. 5 is a process flow showing a specific example of a step S2 of forming a p-type nitride semiconductor layer shown in FIG. 4.

When using the growth reactor 100 configured as mentioned above, the step S21 of forming the Al-containing nitride semiconductor layer and the step S22 of forming the Al-containing compound layer shown in FIG. 5 can be performed in sequence to thereby form the p-type nitride semiconductor layer.

For example, the base 105 formed of a sapphire substrate or the like is disposed at a sample setting portion 110 located at the merging position of the first flow path p1 with the second flow path p2. Then, the source gas of Al is supplied from the first flow path p1, and another source gas as the raw material of the Al-containing nitride semiconductor layer 11a containing N is also supplied from the second flow path p2 to the substrate. Thus, the Al-containing nitride semiconductor layer 11a is grown on or above the base 105 (step S21).

After growing the Al-containing nitride semiconductor layer 11a, the Al-containing compound layer 11b is formed thereon by supplying the source gas of Al from the first flow path p1 and the source gas of C from the second flow path p2 to the Al-containing nitride semiconductor layer 11a (step S22).

In this way, the p-type nitride semiconductor layer 11 can be formed using the growth reactor 100.

When forming the Al-containing nitride semiconductor layer 11a, the source gas of C may or may not be supplied. If the source gas of C is supplied together with the source gas of N, the step of forming the Al-containing nitride semiconductor layer 11a and the step of forming the Al-containing compound layer 11b can be performed in one process. As mentioned in Examples below, it is confirmed that the Al-containing compound layer 11b is formed only at the outermost surface of the p-type nitride semiconductor layer 11 even though the source gas of C is continuously supplied when forming the p-type nitride semiconductor layer 11. In this case, it is also considered that the only Al-containing nitride semiconductor layer is formed while supplying the source gases at the growth temperature maintained, for example, at 1,500° C., and then the Al-containing compound layer is formed thereon while decreasing this temperature after the end of growing the Al-containing nitride semiconductor layer. Thus, even if the source gas of C is continuously supplied when forming the p-type nitride semiconductor layer 11, a multilayer structure including the Al-containing nitride semiconductor layer 11a and the Al-containing compound layer 11b can be obtained. The temperature of the growth zone z2 in this case is set at, for example, 1,500° C.

Alternately, the process in step S21 of forming the Al-containing nitride semiconductor layer and the process in step S22 of forming the Al-containing compound layer may be separately performed. In this case, in step S22, the temperature of the raw material zone z1 can be set at a temperature at which the Al metal 104 is vaporized (for example, 1,400° C.), while the temperature of the growth zone z2 can be set lower than the temperature of the raw material zone z1. Thus, the possibility of damaging the Al-containing nitride semiconductor layer 11a or a layer previously formed on the base 105 can be reduced. The temperature of the growth zone z2 in this case is, for example, 1,000° C. or higher, and can be set at 1,050° C.

In step S2 of forming the p-type nitride semiconductor layer, the process in step S21 of forming the Al-containing nitride semiconductor layer and the process in step S22 of forming the Al-containing compound layer may be individually performed in different growth reactors. For example, an Al-containing nitride semiconductor layer may be formed by metalorganic chemical vapor deposition (MOCVD) in a growth reactor different from the growth reactor 100 (S21). Thereafter, an Al-containing compound layer may be formed by disposing the base, with the Al-containing nitride semiconductor layer formed thereon, in the growth reactor 100, and then by supplying a source gas of Al from the first flow path p1 and a source gas of C from the second flow path p2 to the Al-containing nitride semiconductor layer (S22).

Accordingly, the first embodiment configured as mentioned above can provide the p-type nitride semiconductor layer 11 and the method for forming the same which can exhibit p-type conductivity without being limited to any Al content.

Furthermore, the p-type nitride semiconductor layer 11 of the first embodiment configured as mentioned above can provide a semiconductor device which includes a nitride semiconductor layer and is usable in various applications. Hereinafter, a description will be made on a specific example of the semiconductor device including the p-type nitride semiconductor layer 11 of the first embodiment.

Second Embodiment

A second embodiment according to the present disclosure relates to a nitride semiconductor light-emitting device 200 which is an example of the semiconductor device including the p-type nitride semiconductor layer of the first embodiment. More specifically, the nitride semiconductor light-emitting device 200 of the second embodiment is an example in which the p-type nitride semiconductor layer according to the present disclosure is applied to a nitride semiconductor light-emitting device 200 that emits ultraviolet light and is formed mainly using a nitride semiconductor having a large Al content.

Figure 7:
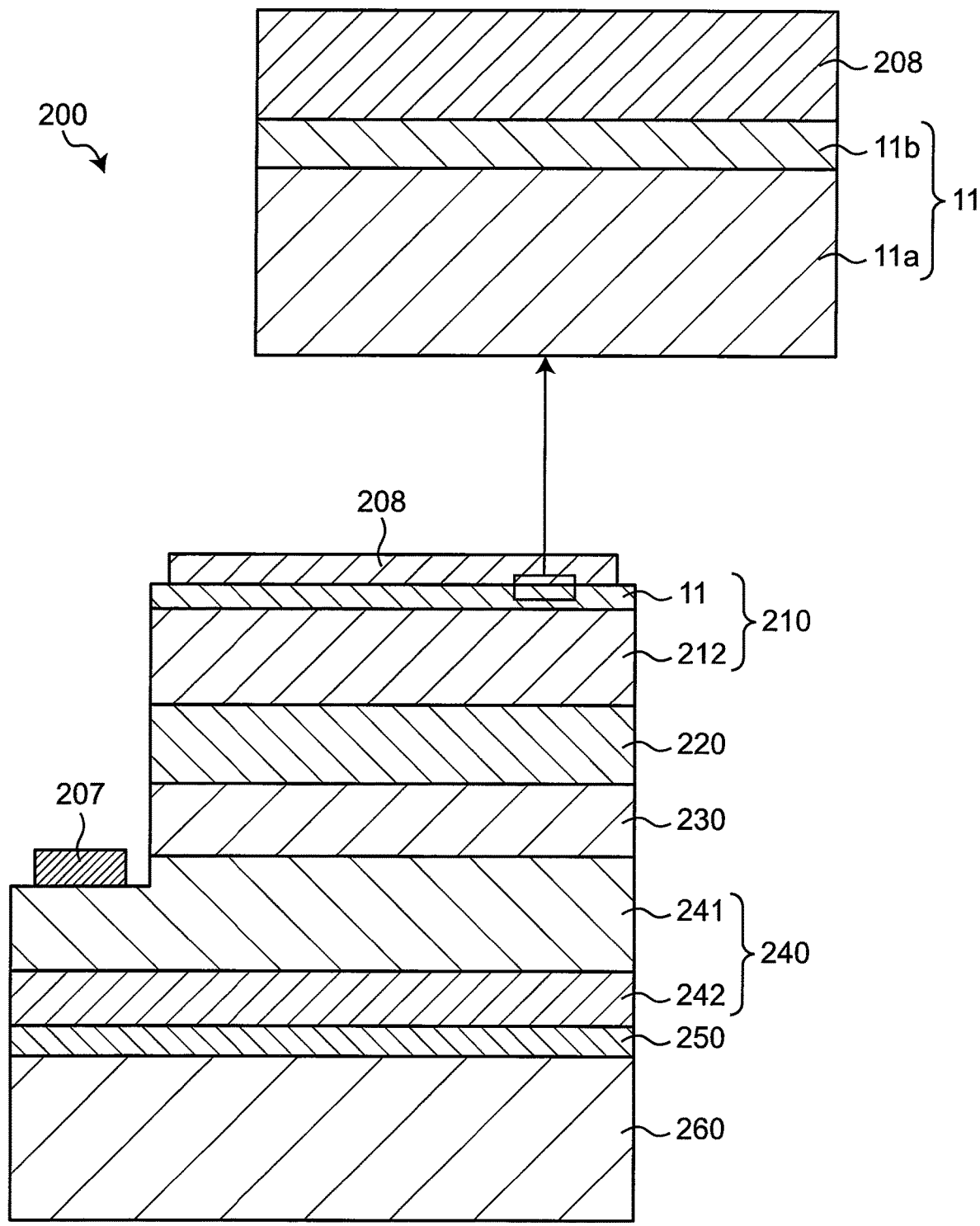
FIG. 7 shows a cross-sectional view and a partially enlarged view of a nitride semiconductor light-emitting device in a second embodiment according to the present disclosure.
Figure 8:
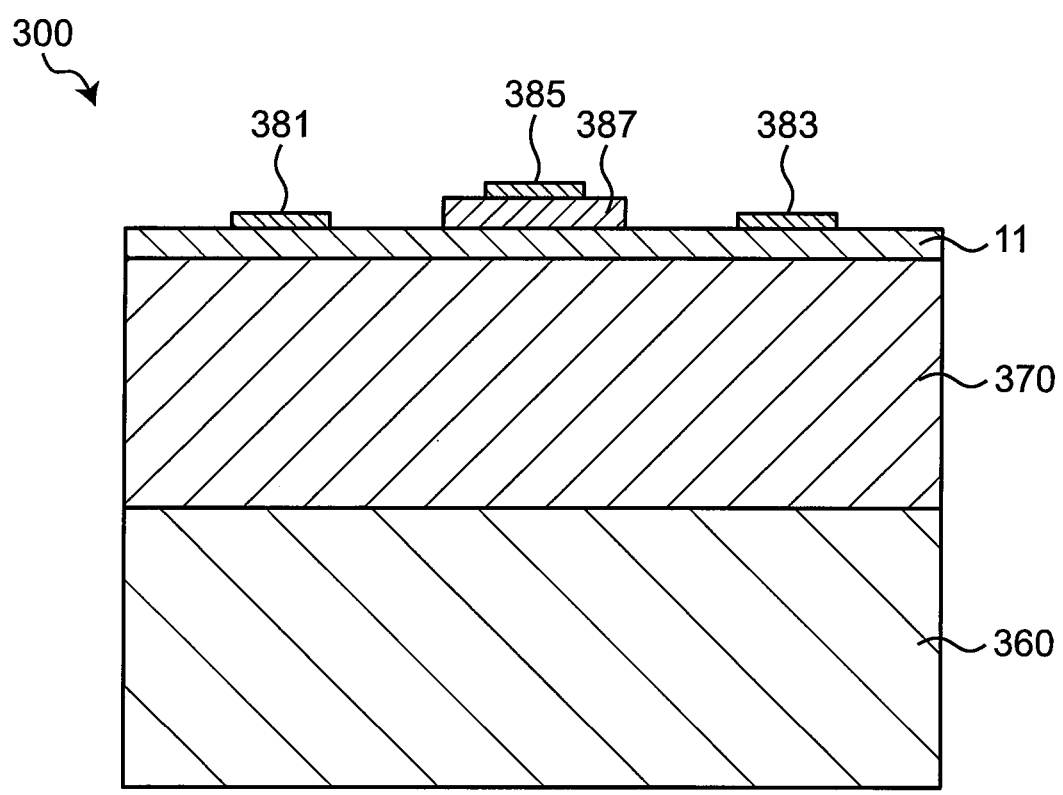
FIG. 8 is a cross-sectional view of a field effect transistor in a third embodiment according to the present disclosure.

As shown in FIG. 7, the nitride semiconductor light-emitting device 200 of the second embodiment includes, for example, a substrate 260 formed of sapphire, an underlayer 250 provided on the substrate 260, an n-side first semiconductor layer 240 provided on the underlayer 250, an active layer 230 provided on the first semiconductor layer 240, an electron blocking layer 220 provided on the active layer 230, and a p-side second semiconductor layer 210 provided on the electron blocking layer 220. The first semiconductor layer 240 includes an n-type nitride semiconductor layer.

In the nitride semiconductor light-emitting device 200 of the second embodiment, the second semiconductor layer 210 includes a p-side contact layer and a p-side cladding layer 212, and the p-side contact layer is constituted of the p-type nitride semiconductor layer 11 according to the present disclosure.

In the nitride semiconductor light-emitting device 200 of the second embodiment, the p-type nitride semiconductor layer, which is the p-side contact layer, is the same as the p-type nitride semiconductor layer 11 of the first embodiment, and thus a description thereof is omitted below. Parts of the nitride semiconductor light-emitting device 200 other than the p-type nitride semiconductor layer 11 will be specifically described below.

A substrate on which a nitride semiconductor can be grown, for example, a substrate formed of sapphire ($Al_2O_3$), AlN, or AlGaN can be used as the substrate 260.

For example, an AlN film may be used as the underlayer 250.

The n-side first semiconductor layer 240 includes, for example, a first composition gradient layer 242 and a second composition gradient layer 241. The first composition gradient layer 242 is formed of, for example, undoped $Al_aGa_{1-a}N$, in which the Al composition ratio "a" sequentially or gradually decreases upward. The second composition gradient layer 241 is formed of, for example, $Al_bGa_{1-b}N$ doped with n-type impurities, such as Si, in which the Al composition ratio "b" sequentially or gradually decreases upward. The n-side first semiconductor layer may not be a composition gradient layer and may be a layer that has a substantially single composition, such as an n-type AlGaN layer.

The active layer 230 has, for example, a quantum-well structure that includes an $Al_cGa_{1-c}N$ well layer and an $Al_dGa_{1-d}N$ barrier layer. For example, to emit deep ultraviolet light with a wavelength of 220 to 350 nm, the active layer 230 is set at have a composition corresponding to a desired wavelength at an Al composition ratio "c" of the well layer that is within the range of $0.4 \leq c \leq 1.0$.

The barrier layer is set at have an Al composition ratio "d" within the range of, for example, $c < d \leq 1.0$ so as to make a bandgap energy of the barrier layer larger than that of the well layer.

In the semiconductor light-emitting device that emits deep ultraviolet light with a peak wavelength of 280 nm, for example, the well layer is constituted of a nitride semiconductor formed of an $Al_{0.45}Ga_{0.55}N$ in which an Al composition ratio "c" is 0.45, while the barrier layer is constituted of a nitride semiconductor formed of $Al_{0.56}Ga_{0.44}N$ in which an Al composition ratio "d" is 0.56.

The second semiconductor layer 210 includes, for example, the p-side cladding layer 212 and the p-side contact layer. The p-side contact layer is constituted of the p-type nitride semiconductor layer 11 of the first embodiment.

The p-side cladding layer 212 can include a nitride semiconductor formed of, for example, $Al_{0.63}Ga_{0.37}N$.

The nitride semiconductor light-emitting device 200 of the second embodiment includes the electron blocking layer 220, which has a bandgap energy larger than that of the barrier layer, between the p-side second semiconductor layer 210 and the active layer 230.

An n-electrode 207 is disposed on an exposed portion of the second composition gradient layer 241 created by removing a partial region of the semiconductor multilayer structure. The n-electrode 207 can be formed of, for example, an alloy of titanium and aluminum by a sputtering method.

A p-electrode 208 is provided on a surface of the Al-containing compound layer 11b. The p-electrode 208 can be formed of, for example, a nickel layer and an aluminum layer by the sputtering method. The p-electrode 208 may be constituted of a laminate structure of a nickel layer and a magnesium layer or a single rhodium layer. In addition, the p-electrode 208 may be formed using a material that is transparent to light emitted from the active layer 230.

The above-mentioned nitride semiconductor light-emitting device 200 of the second embodiment is configured to include the p-type nitride semiconductor layer of the first embodiment as the p-side contact layer. This configuration makes it possible to easily form the p-side contact layer with the p-type conductivity using a nitride semiconductor which has a large Al content. Thus, absorption of ultraviolet light emitted from the active layer in the p-side contact layer can be suppressed, thereby enhancing the light extraction efficiency.

That is, even in a nitride semiconductor light-emitting device that emits ultraviolet light and includes a well layer containing Al, the necessary p-type conductivity is obtained by forming a p-side contact layer using GaN, which has a bandgap smaller than that of the well layer, but in this case, the ultraviolet light emitted in the active layer is absorbed in the p-side contact layer, resulting in reduced light extraction efficiency.

In contrast, however, the above-mentioned nitride semiconductor light-emitting device 200 of the second embodiment is configured to include the p-type nitride semiconductor layer of the first embodiment as the p-side contact layer, which enables the formation of the p-side contact layer having the p-type conductivity, using the nitride semiconductor that has a larger Al content than that in the well layer. Thus, the absorption of ultraviolet light emitted from the active layer 230 in the p-side contact layer can be suppressed, thereby enhancing the light extraction efficiency.

Third Embodiment

A third embodiment according to the present disclosure shows another example of the semiconductor device that includes the p-type nitride semiconductor layer of the first embodiment. The present third embodiment relates to a field effect transistor 300 that has a metal-insulator-semiconductor (MIS) structure including the p-type nitride semiconductor layer according to the present disclosure.

The field effect transistor 300 of the third embodiment includes the p-type nitride semiconductor layer 11 of the first embodiment that is provided on a substrate 360 made of, for example, sapphire via a nitride semiconductor layer 370 made of, for example, AlN. A source electrode 381, a gate electrode 385, and a drain electrode 383 are provided over the p-type nitride semiconductor layer 11. The gate electrode 385 is located between the source electrode 381 and the drain electrode 383, each of which is in ohmic contact with the p-type nitride semiconductor layer 11. The gate electrode 385 is provided over the p-type nitride semiconductor layer 11 via an insulating film 387.

The field effect transistor 300 of the third embodiment configured as mentioned above includes the p-type nitride semiconductor layer 11 of the first embodiment which can exhibit the p-type conductivity even though the Al content therein is large. This configuration enables the formation of a hole channel with a wide bandgap, especially, the provision of power device transistors. It is noted that the nitride semiconductor layer 370 may not be provided.

EXAMPLES

Examples according to the present disclosure will be described below.

Examples 1 to 3 below are examples of fabricating samples using the growth reactor 100 shown in FIG. 6. Comparative Example 1 is an example of fabricating a sample for comparison with Examples 1 to 3.

Examples 1 to 3

In Examples 1 to 3, a sapphire substrate 460 was disposed at a merging position of the first flow path p1 with the second flow path p2 in the growth reactor 100. Then, the source gas of Al was supplied along the upper surface of the sapphire substrate 460 via the first flow path p1 while $N_2$ gas (source gas of N) and $C_3H_8$ gas (source gas of C) were supplied from above to the upper surface of the sapphire substrate 460 via the second flow path p2. In this way, an Al-containing nitride semiconductor layer was formed of the AlN layer, and then an Al-containing compound layer was formed on the AlN layer. The total thickness of the Al-containing nitride semiconductor layer and the Al-containing compound layer was approximately 0.5 μm.

In Examples 1 to 3, the samples were fabricated on the same conditions except for the flow rate of $C_3H_8$ (source gas of C).

Specifically, in Example 1, the flow rate of $C_3H_8$ was set at 0.2 sccm; in Example 2, the flow rate of $C_3H_8$ was set at 0.4 sccm; and in Example 3, the flow rate of $C_3H_8$ was set at 0.8 sccm. In Examples 1 to 3, the flow rate of $N_2$ (source gas of N) was set at 3,000 sccm.

In Examples 1 to 3, the respective flow rates of the source gases other than $C_3H_8$ (source gas of C) were set as follows.
Source gas of Al: 2.5 sccm
Source gas of N: 3,000 sccm
Carrier gas (Ar) for Al source: 600 sccm When fabricating the samples of Examples 1 to 3, in the growth reactor 100, the temperature of the raw material zone z1 was set at 1,450° C., while the temperature of the growth zone z2 was set at 1,500° C. After the temperature of the raw material zone Z1 and the temperature of the growth zone z2 were maintained at 1,450° C. and 1,500° C., respectively, for 60 minutes, the temperature of the raw material zone z1 and the temperature of the growth zone z2 were naturally decreased while causing the source gases to flow in the growth reactor.

The sheet carrier density and the conductivity type of the p-type nitride semiconductor layer formed on the sapphire substrate were measured for the respective samples in Examples 1 to 3 fabricated in the way mentioned above. The sheet carrier densities of the samples were as follows.
Example 1: $4.45 \times 10^{13}/cm^2$
Example 2: $3.85 \times 10^{13}/cm^2$
Example 3: $2.64 \times 10^{14}/cm^2$
Each of the samples exhibited the p-type conductivity.

Comparative Example 1

In Comparative Example 1, a sample was fabricated in the same way as that in Examples 1 to 3 except that $C_3H_8$ (source gas of C) was not supplied. In the sample of Comparative Example 1, substantially no electricity flowed, and no p-type conductivity was exhibited.

In contrast, in Examples 1 to 3, all the samples that were fabricated on the same conditions except for the flow rate of $C_3H_8$ (source gas of C) exhibited the p-type conductivity.

As is understood from this, it is not necessarily right that the p-type conductivity was exhibited only when the Al-containing compound layer 11*b* had the specific composition. That is, when changing the flow rate of $C_3H_8$ (source gas of C) while making the flow rate of the source gas of Al constant among Examples 1 to 3, the composition ratio of C to Al in the Al-containing compound layer varies because of the different flow rates of $C_3H_8$ (source gas of C). Nevertheless, all the samples in Examples 1 to 3 exhibited the p-type conductivity, which shows that the specific composition of the Al-containing compound layer 11*b* is not essential to the p-type conductivity.

Figure 9:
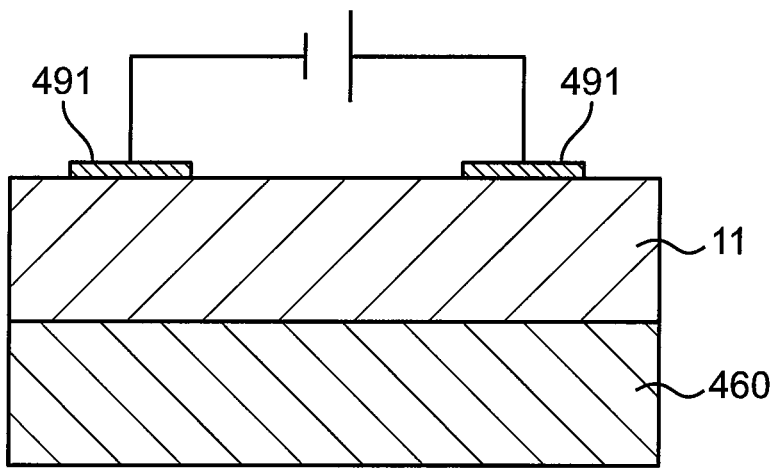
FIG. 9 is a schematic cross-sectional view when measuring a surface resistance in the vicinity of the surface of the p-type nitride semiconductor layer in Examples according to the present disclosure.
Figure 10:
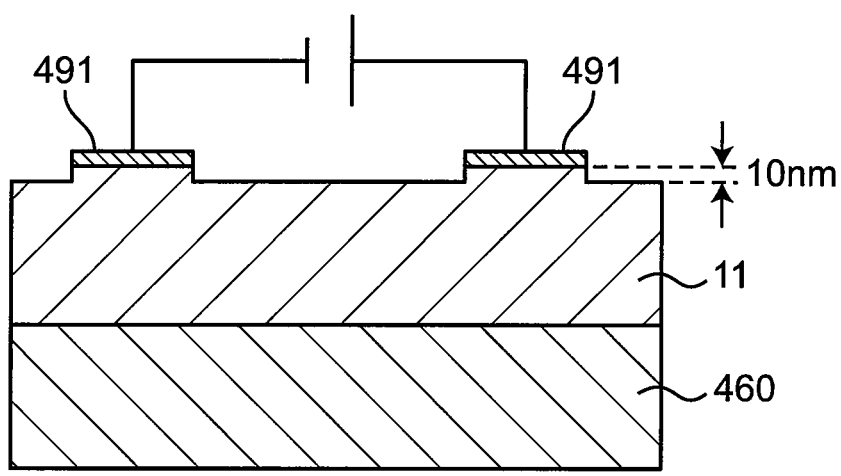
FIG. 10 is a schematic cross-sectional view of the p-type nitride semiconductor layer according to Examples of the present disclosure, when measuring the surface resistance in the vicinity of the surface of the p-type nitride semiconductor layer after the Al-containing compound layer is removed.

To evaluate the influence of the Al-containing compound layer in the p-type nitride semiconductor layer formed on the sapphire substrate, the sample of Example 1 was examined for a current value flowing through the vicinity of the surface of the p-type nitride semiconductor layer 11 by the methods shown in FIGS. 9 and 10.

Specifically, as shown in FIG. 9, measurement electrodes 491 made of Ni were separately formed on the surface of the Al-containing compound layer of the sample in Example 1, and then the surface current flowing between the electrodes was examined. As a result, the current of approximately 20 μA flowed at a voltage of 5 V.

Then, while the measurement electrodes 491 shown in FIG. 9 were maintained, parts of the p-type nitride semiconductor layer 11 with a thickness of 10 nm from its surface were removed by reactive ion etching so as to leave regions of the semiconductor layer 11 directly under the measurement electrodes 491. In this state, the surface current flowing between the electrodes was examined as shown in FIG. 10. Since the thickness of the Al-containing compound layer in the sample of Example 1 was estimated to be less than 10 nm, the Al-containing compound layer was thought not to exist between the electrodes in the state shown in FIG. 10.

As a result, the current flowing at a voltage of 5 V was approximately 3 to 4 nA, which was lower by three or more orders of magnitude than that before the reactive ion etching, which meant that substantially no current flowed.

From the above-mentioned results, it can be seen that only the Al-containing nitride semiconductor layer from which the Al-containing compound layer is removed in the p-type nitride semiconductor layer 11 does not exhibit p-type conductivity.

Examples 4 and 5

Figure 11:
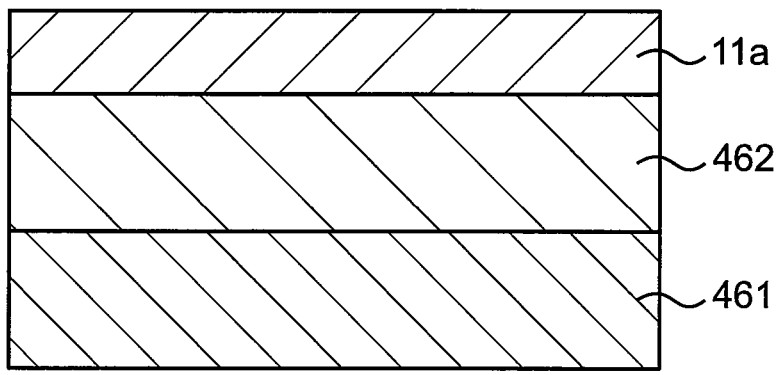
FIG. 11 is a cross-sectional view of a base prior to forming the Al-containing compound layer in Examples 4 and 5 according to the present disclosure.

In Examples 4 and 5, first, as shown in FIG. 11, by the metalorganic vapor phase epitaxy, an underlayer 462 made of AlN was grown on the sapphire substrate 460 so as to have a thickness of 3.5 μm, and then an Al-containing nitride semiconductor layer 11a made of AlGaN (Mg-doped AlGaN) containing Al and Ga doped with Mg was formed on the underlayer 462 so as to have a thickness of 0.5 μm. In this way, the base was fabricated.

Then, the thus-obtained base was disposed at a merging position of the first flow path p1 with the second flow path p2 in the growth reactor 100, and subsequently the source gas of Al was supplied along the upper surface of the Al-containing nitride semiconductor layer 11a via the first flow path p1, while $C_3H_8$ gas (source gas of C) was supplied from the vertical direction to the upper surface of the Al-containing nitride semiconductor layer 11a via the second flow path p2. In this way, an Al-containing compound layer was formed on the Al-containing nitride semiconductor layer 11a. When forming the Al-containing compound layer, the flow rate of the source gas supplied from each of the first flow path p1 and the second flow path p2 in the growth reactor 100 in Examples 4 and 5 was set at the same level as that in Example 1.

In the way mentioned above, the samples of Examples 4 and 5, each including the p-type nitride semiconductor layer which was composed of the Al-containing nitride semiconductor layer 11a made of the Mg-doped AlGaN and the Al-containing compound layer 11b, were fabricated.

Here, Examples 4 and 5 differ from each other in the composition ratio between Al and Ga in the Al-containing nitride semiconductor layer 11a, but are the same in other aspects. Specifically, the Al-containing nitride semiconductor layer 11a in Example 4 was made of $Al_{0.3}Ga_{0.7}N$, and the Al-containing nitride semiconductor layer 11a of Example 5 was made of $Al_{0.8}Ga_{0.2}N$. In each of Examples 4 and 5, the growth conditions were set so that the Mg concentration was within the range of $2.0 \times 10^{19}$ to $4.0 \times 10^{19}/cm^3$.

The sheet carrier density and the conductivity type of the p-type nitride semiconductor layer (Mg-doped AlGaN layer+Al-containing compound layer) formed above the sapphire substrate were measured and examined for the respective samples in Examples 4 and 5 fabricated in the way mentioned above. The sheet carrier densities of the samples were as follows.

Example 4: $6.47 \times 10^{13}/cm^2$
Example 5: $4.89 \times 10^{13}/cm^2$

Each of the samples exhibited the p-type conductivity.

The current-voltage characteristics at this time exhibited ohmic characteristics.

Comparative Examples 2 and 3

In Comparative Example 2, the conductivity type of an Al-containing nitride semiconductor layer 11a which was composed of $Al_{0.3}Ga_{0.7}N$ without having an Al-containing compound layer was examined. As a result, the Al-containing nitride semiconductor layer 11a did not exhibit any p-type conductivity, and the current value was lower by two orders of magnitude than a current value at the same voltage in Example 4. The current-voltage characteristics at this time exhibited Schottky characteristics.

In Comparative Example 3, the conductivity type of an Al-containing nitride semiconductor layer 11a which was composed of $Al_{0.8}Ga_{0.2}N$ without having an Al-containing compound layer was examined. As a result, the Al-containing nitride semiconductor layer 11a did not exhibit any p-type conductivity, and the current value was lower by four or more orders of magnitude than a current value at the same voltage in Example 5. The current-voltage characteristics at this time exhibited Schottky characteristics.

After removing the Al-containing compound layer from each sample of Examples 4 and 5 by the method shown in FIG. 10, the current flowing through the vicinity of the surface of the sample was measured. As a result, the current value of each of the samples in Examples 4 and 5 was higher than the current value measured at the same voltage in Comparative Examples 2 and 3. This is considered to be because the Al-containing compound layer remaining directly under the electrode maintains the p-type conductivity directly under the electrode.

What is claimed is:

1. A method of forming a p-type nitride semiconductor layer comprising:
   preparing a base; and
   providing the p-type nitride semiconductor layer on or above the base by forming an Al-containing nitride semiconductor layer on or above the base and then forming an Al-containing compound layer that consists essentially of Al and C as main constituent elements on a surface of the Al-containing nitride semiconductor layer by supplying a source gas including a source gas of Al and a source gas of C.

2. The method according to claim 1, wherein the providing the p-type nitride semiconductor layer comprises:
   forming the Al-containing nitride semiconductor layer on or above the base by supplying a source gas containing a source gas of Al and a source gas of N and,
   forming the Al-containing compound layer on the surface of the Al-containing nitride semiconductor layer.

3. The method according to claim 1, wherein the providing the p-type nitride semiconductor layer comprises:
   forming the Al-containing nitride semiconductor layer on or above the base by supplying a source gas containing a source gas of Al and a source gas of N and,
   forming the Al-containing compound layer on the surface of the Al-containing nitride semiconductor layer by supplying the source gas containing the source gas of Al and the source gas of C.

4. The method according to claim 1,
   wherein, in the preparing the base, the base is disposed at a merging position between a first flow path and a second flow path, and
   wherein, in the forming the Al-containing compound layer, the Al-containing compound layer is formed by supplying the source gas of Al from the first flow path and the source gas of C from the second flow path in the forming the Al-containing compound layer.

5. The method according to claim 4, wherein an Al metal is vaporized in the first flow path for the source gas of Al.

6. The method according to claim 1, wherein $C_3H_8$ is used as the source gas of C.

* * * * *